United States Patent
Plus

Patent Number: 5,222,082
Date of Patent: Jun. 22, 1993

[54] SHIFT REGISTER USEFUL AS A SELECT LINE SCANNER FOR LIQUID CRYSTAL DISPLAY

[75] Inventor: Dora Plus, South Bound Brook, N.J.

[73] Assignee: Thomson Consumer Electronics, S.A., Courbevoie, France

[21] Appl. No.: 660,272

[22] Filed: Feb. 28, 1991

[51] Int. Cl.[5] .................... G11C 19/18; G11C 19/28
[52] U.S. Cl. .......................................... 377/79; 377/76; 377/105; 307/269; 307/577; 307/453
[58] Field of Search ............... 377/64, 70, 74, 76–79, 377/105, 117, 121; 307/269, 577, 448, 578, 453, 368, 481; 340/811, 784, 340; 359/85

[56] References Cited

U.S. PATENT DOCUMENTS

| | | | |
|---|---|---|---|
| 3,898,479 | 8/1975 | Proebsting | 377/79 |
| 3,909,627 | 9/1975 | Mizuno | 307/453 |
| 3,937,984 | 2/1976 | Fry | 377/79 |
| 4,017,741 | 4/1977 | Briggs | 377/79 |
| 4,084,106 | 4/1978 | Ullrich | 377/79 |
| 4,439,691 | 3/1984 | Bartoli et al. | 377/79 |
| 4,714,840 | 12/1987 | Proebsting | 307/448 |
| 4,890,308 | 12/1989 | Imai | 377/105 |
| 4,930,875 | 6/1990 | Inoue et al. | 359/57 |
| 4,958,085 | 9/1990 | Hashimoto et al. | 307/511 |

Primary Examiner—John S. Heyman
Assistant Examiner—Tai V. Duong
Attorney, Agent, or Firm—J. S. Tripoli; D. H. Irlbeck; L. L. Hallacher

[57] ABSTRACT

A select line scanner for a liquid crystal display includes a plurality of cascaded stages each having an input terminal and an output terminal. Each stage includes an output circuit which switches the output terminal between high and low states. A first node switches the output terminal in response to an input signal and a second node keeps the output terminal low between the input pulse and a clocking pulse.

5 Claims, 4 Drawing Sheets

SHIFT REGISTER USEFUL AS A SELECT LINE SCANNER FOR LIQUID CRYSTAL DISPLAY

BACKGROUND

This invention relates generally to shift registers and particularly to a shift register useful as a select line scanner for liquid crystal displays.

Liquid crystal television and computer displays (LCDs) are known in the art. For example, see U.S. Pat. Nos. 4,742,346 and 4,766,430, both issued to G. G. Gillette et al. and incorporated herein by reference. Displays of the type described in the Gillette patents include a matrix of liquid crystal cells which are arranged at the crossovers of data lines and select lines. The select lines are sequentially selected by a select line scanner to produce the horizontal lines of the display. The data lines apply the brightness (gray scale) signals to the columns of liquid crystal cells as the select lines are sequentially selected. Each liquid crystal cell is associated with a switching device through which a ramp voltage is applied to the liquid crystal cells in the selected line. Each of the switching devices is held on by a comparator, or a counter, which receives the brightness signal to permit the ramp voltage to charge the associated liquid crystal cell to a voltage proportional to the brightness level received by the comparator from the data line.

Preferably, the drive circuitry, which drives the data lines, and the select line scanner, which selects the horizontal lines to be displayed, are fabricated directly onto the same substrate as the liquid crystal cells at the same time that the switching devices are fabricated. Also, because a large number of data lines and select lines are required for a television or computer display, and because the small pixel pitch limits the space available for laying out the driver circuitry, it is essential to keep the circuitry as simple as possible in order to obtain high manufacturing yield. It can also be advantageous to utilize solid state devices of the same conductivity type throughout the display device. For these reasons, there is a need for a simple, reliable select line scanner for use in liquid crystal displays. The invention fulfills this need by a provision of a multistage shift register wherein each stage is comprised of a minimum number of solid state devices which, preferably, are thin film transistors (TFT's), and all of which can be of the same conductivity type.

CROSS REFERENCE TO RELATED APPLICATIONS

This invention can be used with the invention described in copending application Ser. No. 660,274 filed concurrently herewith by Antoine DuPont and Dora Plus and titled "Redundant Shift Register For Scanning Devices".

SUMMARY

A shift register comprising a plurality of substantially identical cascaded stages includes means for providing a plurality of phase shifted clock signals and means for providing an input signal. Each stage includes an output circuit for switching the voltage on the output terminal between high and low values. The output circuit includes a first solid state device for transferring a first of the clock signals to the output terminal and switch the output terminal high in response to a first switching signal. A second solid state device transfers a low voltage to the output terminal and switches the output terminal low in response to a second switching signal. The conduction paths of the solid state devices are serially connected at the output terminal. A first switching node provides the first switching signal in response to the input signal. A second switching node provides the second switching signal in response to a second of the clock signals.

DETAILED DESCRIPTION

Figure 1:
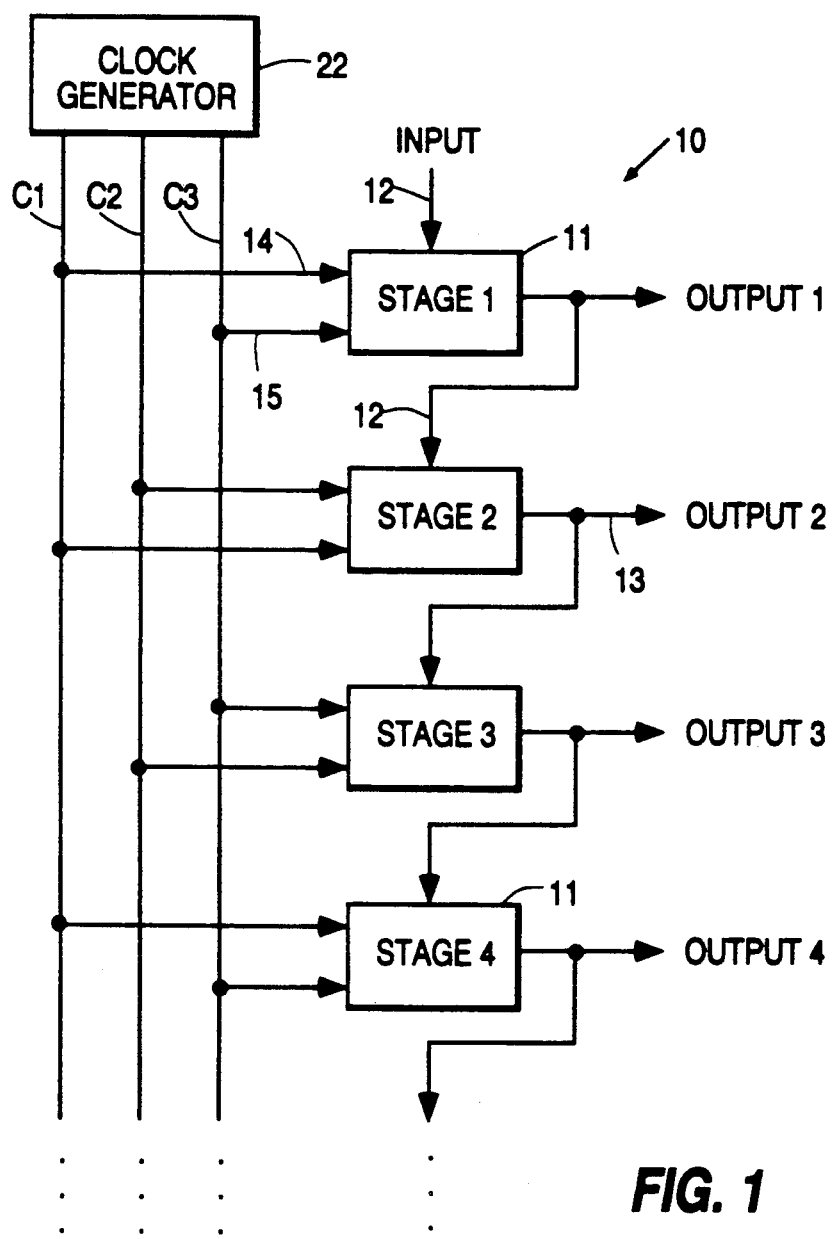
FIG. 1 is a block diagram of a shift register including the plurality of cascaded stages made in accordance with the present invention.
Figure 4:
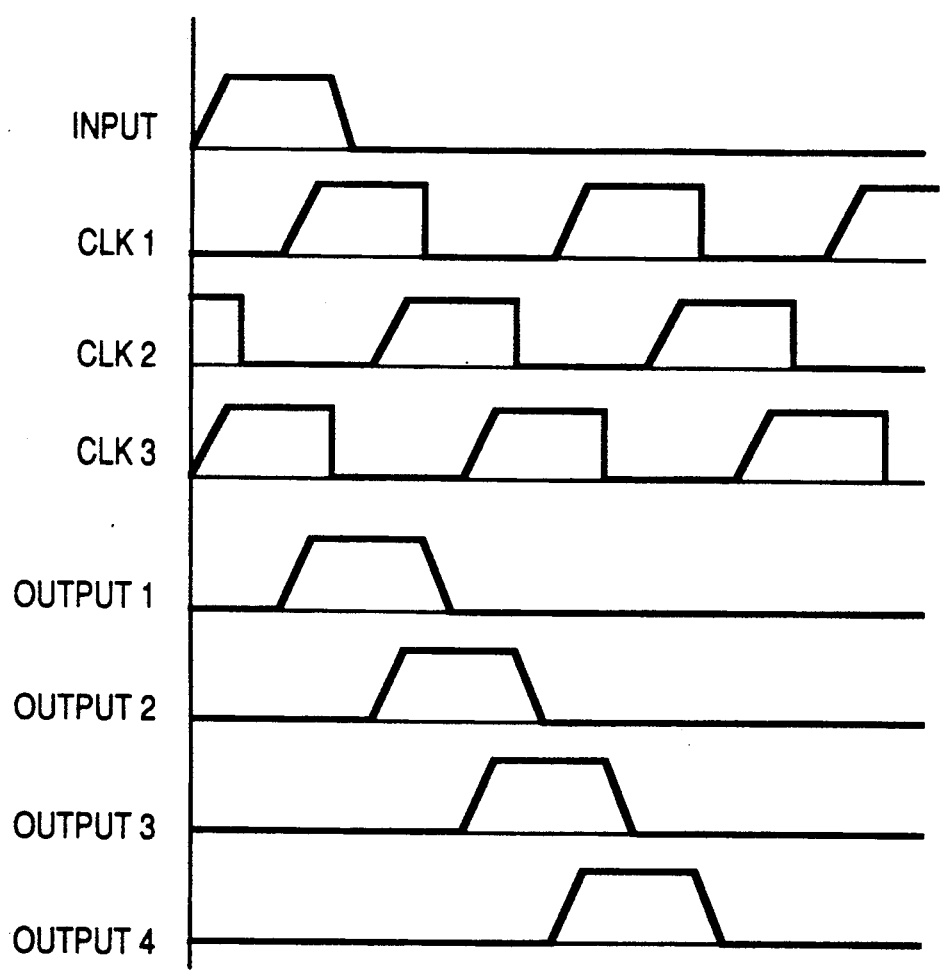
FIG. 4 shows the relationship of three clocks and four output pulses.

In FIG. 1, a shift register 10, which can be used as the select line scanner for a liquid crystal display, includes a plurality of substantially identical stages 11, each of which has an input terminal 12 and an output terminal 13. The stages 11 are cascaded whereby the output terminal 13 of each stage is connected to the input terminal 12 of the immediately succeeding stage. Each stage 11 also includes two clock input terminals 14 and 15. A clock generator 22 provides three phase shifted clock signals C1, C2 and C3. Different pairs of clock signals are applied to the clock terminals 14 and 15 of each stage whereby each stage receives a pair which is different from the pairs received by the adjacent stages. The relationships of the clock pulses C1, C2, C3 and four output pulses is shown in FIG. 4.

Figure 2:
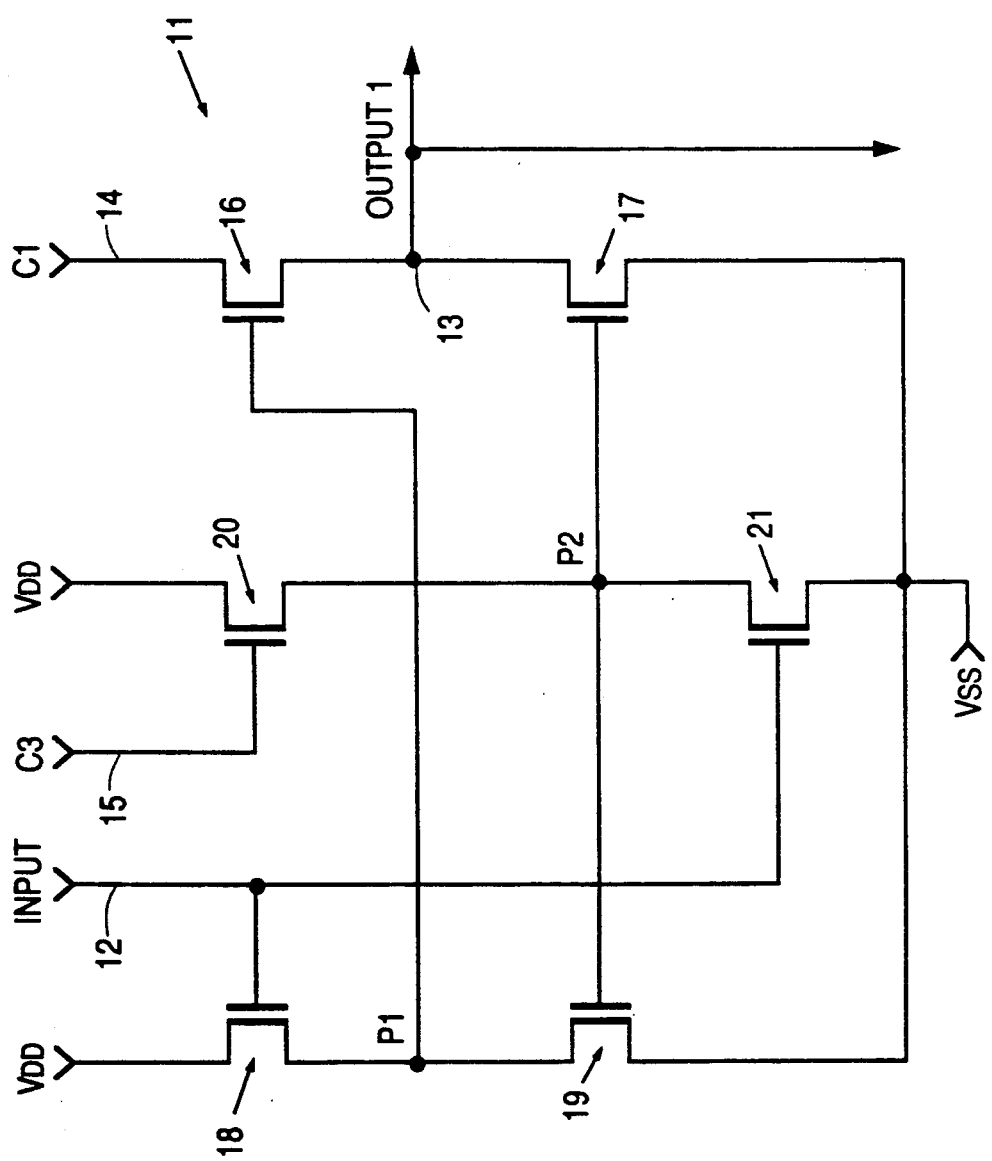
FIG. 2 is a preferred embodiment of the shift register stages shown in FIG. 1.
Figure 3:
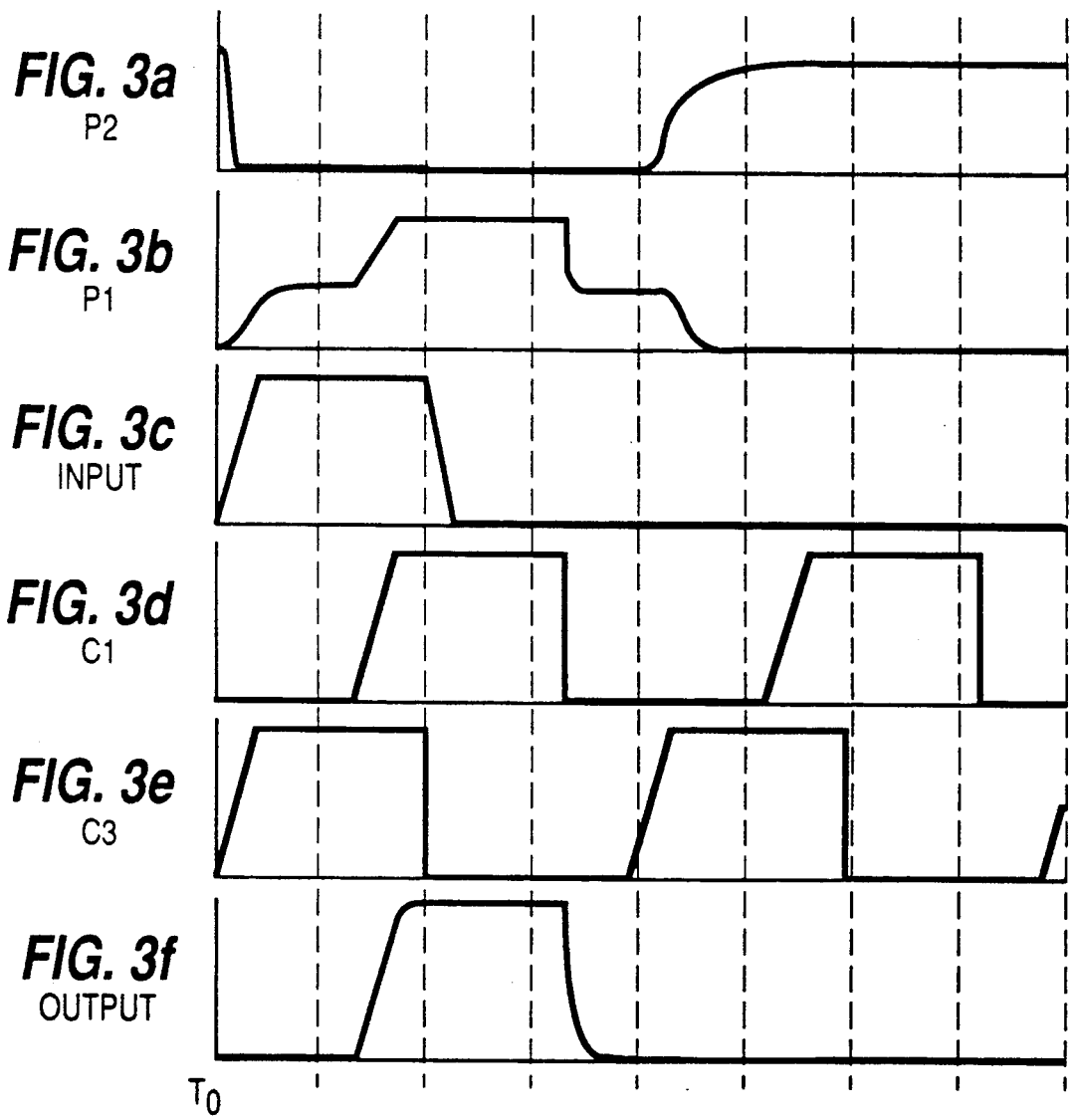
FIGS. 3a to 3f show the operational waveforms of the preferred embodiment of FIG. 2.

FIG. 2 is a preferred embodiment of the circuitry included in each of the stages 11 of FIG. 1. In FIG. 2, an output circuit includes two solid state devices 16 and 17, which preferably are thin film transistors (TFT's), having conduction paths serially connected at output terminal 13. A first switching circuit includes solid state devices 18 and 19, which also preferably are TFT's, having their conduction paths serially connected at a first switching node P1. Another switching circuit includes solid state devices 20 and 21, which also preferably are TFT's, having their conduction paths serially connected at a second switching node P2.

The drains of TFT's 18 and 20 receive a relatively positive biasing voltage $V_{DD}$ and the drain of TFT 16 receives the clock signal C1. The sources of TFT's 17, 19 and 21 receive a relatively negative biasing voltage $V_{SS}$. The control electrodes of TFT's 18 and 21 are responsive to input terminal 12. The control electrodes of TFT's 17 and 19 are responsive to the second switching node P2. The control electrode of TFT 16 is responsive to the first switching node P1, while the control electrode of TFT 20 receives the clock signal C3. In the FIG. 2 embodiment, all the TFT's 16 to 21 are of the same conductivity type and thus can be fabricated from amorphous silicon, for example.

The operation can be understood from FIGS. 2 and 3a to 3f. The waveforms of FIGS. 3a to 3f are for n-type conductivity devices. Assume that conditions exist as shown at time $T_0$ in FIGS. 3a to 3f. At time $T_0$ node P2 (FIG. 3a) is high and TFT 17 is on and output terminal 13 is biased low by the relatively negative voltage $V_{SS}$.

When an input pulse (FIG. 3c) is applied to input terminal 12 and a clock pulse C3 (FIG. 3e) is applied to clock terminal 15, TFT's 18, 20 and 21 simultaneously begin to turn on. Accordingly, node P1 begins to go positive (FIG. 3b), to a voltage equal to $V_{DD}$ minus the threshold voltage $V_{TH}$ of TFT 18 and TFT 16 is armed. At the same time, node P2 goes low (FIG. 3a) because of the strong turning on of TFT 21. With node P2 low TFT 17 turns off, however output terminal 13 remains low because the clock pulse C1 is low and thus nothing has happened to pull the node up. When a high clock pulse C1 (FIG. 3d) is applied to clock terminal 14, the control electrode of TFT 16 is already precharged high and the gate/drain intrinsic coupling boosts node P1 to a voltage equal to $V_{DD}-V_{TH}$ plus approximately 90% of the swing of the clock pulse C1. This allows output terminal 13 (FIG. 3f) to follow the clock pulse C1. The output pulse turns on one select line of the display device, and also provides a high input pulse to the succeeding stage. TFT's 20 and 21 are ratioed whereby TFT 21 is much larger than TFT 20, for example 10 times, to overpower TFT 20 and node P2 remains low during the selection period when the C3 clock pulse is high. When the C1 clock returns to low, node P1 returns to approximately the precharged voltage. When the C3 clock pulse goes high node P2 is pulled high and TFT 17 turns on and output node 13 goes low.

What is claimed is:

1. A shift register comprising a plurality of substantially identical cascaded stages, each of said stages having an input terminal and an output terminal, said shift register including means for providing a plurality of phase shifted clock signals and means for providing an input signal; each of said stages comprising:

an output circuit for switching the voltage on said output terminal between high and low values, said output circuit including a first solid state device for transferring a first of said clock signals to said output terminal in response to a first switching signal, and a second solid state device for transferring a low voltage to said output terminal in response to a second switching signal, said first and second said solid state devices having conduction paths serially connected at said output terminal;

a first switching circuit for receiving an input signal at said input terminal, said first switching circuit including a first node for providing said first switching signal to said first solid state device in response to said input signal; and a second switching circuit for receiving a second of said clock signals, said second switching circuit including a second node for providing said second switching signal to said second solid state device in response to said second clock signal and a third solid state device in response to said input signal for maintaining said second node at a low potential when said second clock signal initially goes high.

2. The shift register of claim 1 wherein said said second switching circuit further comprises a fourth solid state device connected to said second node and being responsive to said second of said clock signals, and wherein said first switching circuit also comprises a fifth solid state device connected to said first node and being responsive said input signal.

3. The shift register of claim 2 wherein said first switching circuit further comprises a sixth solid state device connected to said first node and being responsive to said second switching signal.

4. The shift register of claim 3 wherein said fourth and third solid state devices are ratioed whereby said third solid state device is substantially larger than said fourth solid state device to maintain said second node at said low potential when said fourth solid state device is turned on.

5. The shift register of claim 4 wherein said solid state devices are thin film transistors.

* * * * *